United States Patent
Park et al.

(10) Patent No.: US 9,581,872 B2
(45) Date of Patent: Feb. 28, 2017

(54) SLOT DIE COATING APPARATUS AND COATING METHOD USING THE SAME

(71) Applicants: Samsung Display Co., Ltd., Yongin (KR); K.C. TECH CO., LTD., Anseong-si (KR)

(72) Inventors: Jae Cheol Park, Hwaseong-si (KR); Gyeong Eun Eoh, Seoul (KR); Jong Soo Kim, Asan-si (KR); Jun Heui Lee, Seoul (KR); Jong Wan Choi, Seoul (KR); Won Hyeng Pyen, Yongin-si (KR); Dae Ho Song, Hwaseong-si (KR); Seong Gyu Kwon, Suwon-si (KR); Kang-Il Cho, Anseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/623,468

(22) Filed: Feb. 16, 2015

(65) Prior Publication Data

US 2016/0016185 A1    Jan. 21, 2016

(30) Foreign Application Priority Data

Jul. 18, 2014   (KR) ................. 10-2014-0091126

(51) Int. Cl.
*B05D 5/06*    (2006.01)
*B05C 5/00*    (2006.01)
(Continued)

(52) U.S. Cl.
CPC ............. *G02F 1/136* (2013.01); *B05B 1/044* (2013.01); *B05B 3/18* (2013.01); *B05C 5/0254* (2013.01);
(Continued)

(58) Field of Classification Search
CPC ... H01L 27/124; H01L 27/1262; B05B 1/044; B05B 3/18; B05C 5/0254;
(Continued)

(56) References Cited

U.S. PATENT DOCUMENTS 8,117,983 B2 *   2/2012   Fork ................... B29C 47/0002
                                                  118/410
9,212,089 B2 *  12/2015   Arsten ................. C03C 17/006
(Continued)

FOREIGN PATENT DOCUMENTS

KR   10-2011-0063414   6/2011
KR   10-2012-0063947   6/2012
KR   10-2013-0068665   6/2013

*Primary Examiner* — Dao H Nguyen
(74) *Attorney, Agent, or Firm* — H.C. Park & Associates, PLC

(57) ABSTRACT

A slot die coater planarizing an upper surface of an encapsulation layer and a coating method using the same. The slot die coater includes a slit nozzle configured to supply a coating solution. The slit nozzle includes a hole vertically penetrating a center portion thereof, a first bottom surface disposed at a movement direction side of the slit nozzle with reference to the hole, and a second bottom surface disposed at an opposite direction side of the movement direction of the slit nozzle with reference to the hole. A width of the first bottom surface is different from the width of the second bottom surface.

7 Claims, 9 Drawing Sheets

(51) Int. Cl.
| | | |
|---|---|---|
| *B05B 1/04* | (2006.01) | |
| *G02F 1/136* | (2006.01) | |
| *H01L 27/12* | (2006.01) | |
| *B05C 5/02* | (2006.01) | |
| *B05B 3/18* | (2006.01) | |
| *G02F 1/13* | (2006.01) | |
| *G02F 1/1333* | (2006.01) | |
| *B05C 11/10* | (2006.01) | |
| *G02F 1/1343* | (2006.01) | |

(52) U.S. Cl.
CPC ...... *G02F 1/1303* (2013.01); *G02F 1/133377* (2013.01); *H01L 27/124* (2013.01); *H01L 27/1262* (2013.01); *B05C 11/10* (2013.01); *G02F 2001/133357* (2013.01); *G02F 2001/134345* (2013.01)

(58) Field of Classification Search
CPC ........ B05C 11/10; B02F 1/136; B02F 1/1303; B02F 1/133377
USPC ........ 257/72, E23.173; 239/102.2, 597, 602; 427/160, 162, 420; 428/38, 447; 438/26; 118/200, 302, 323, 410; 204/510
See application file for complete search history.

(56) References Cited

U.S. PATENT DOCUMENTS

| | | | | |
|---|---|---|---|---|
| 2003/0021906 | A1* | 1/2003 | Sago | H01L 21/6715 427/420 |
| 2006/0040079 | A1* | 2/2006 | Sekihara | B05D 1/265 428/38 |
| 2007/0231478 | A1* | 10/2007 | Watanabe | G02B 1/111 427/162 |
| 2010/0092788 | A1* | 4/2010 | Naito | B41J 2/161 428/447 |
| 2015/0075424 | A1* | 3/2015 | Lim | B05C 5/0254 118/323 |

* cited by examiner

SLOT DIE COATING APPARATUS AND COATING METHOD USING THE SAME

CROSS-REFERENCE TO RELATED APPLICATION

This application claims priority from and the benefit of Korean Patent Application No. 10-2014-0091126, filed on Jul. 18, 2014, which is hereby incorporated by reference for all purposes as if fully set forth herein.

BACKGROUND

Field

Exemplary embodiments relate to a slot die coating apparatus using a slot die coater, and a coating method using the same. More particularly, the present invention relates to a slot die coater configured to flatten an upper surface of an encapsulation layer, and a coating method using the same.

Discussion of the Background

A liquid crystal display (hereinafter "LCD") is one of the most widely used flat panel displays. The LCD includes two display panels provided with electric field generating electrodes, such as pixel electrodes and a common electrode, and a liquid crystal layer interposed between the two display panels. In the LCD, voltages are applied to the electric field generating electrode to generate an electric field in the liquid crystal layer. As a result of the generated electric field, liquid crystal molecules of the liquid crystal layer are aligned and polarization of incident light is controlled, thereby displaying images.

Two display panels forming the liquid crystal display may be made of a thin film transistor array panel and an opposing display panel. In the thin film transistor array panel, a gate line transmitting a gate signal and a data line transmitting a data signal are formed to cross each other, and a thin film transistor connected to the gate line and data line and a pixel electrode connected to the thin film transistor may be formed. The opposing display panel may include a light blocking member, a color filter, a common electrode, etc. If necessary, the light blocking member, the color filter, and the common electrode may be formed in the thin film transistor array panel.

Recently, significant research has been performed in an attempt to reduce cost by forming the constituent elements on one substrate. In this case, after forming the liquid crystal layer, a process of forming an encapsulation layer sealing the liquid crystal layer and adhering a polarizer thereon is performed. However, the resulting encapsulation layer is not flat such that lifting of the polarizer may be generated.

The above information disclosed in this Background section is only for enhancement of understanding of the background of the inventive concept and, therefore, it may contain information that does not constitute prior art.

SUMMARY

Exemplary embodiments provide a slot die coater configured to flatten an upper surface of an encapsulation layer, and a coating method using the same.

Additional aspects will be set forth in the detailed description which follows, and, in part, will be apparent from the disclosure, or may be learned by practice of the inventive concept.

An exemplary embodiment of the present invention includes a slot die coater including a slit nozzle configured to supply a coating solution. The slit nozzle includes a hole vertically penetrating a center portion thereof, a first bottom surface positioned at a movement direction side of the slit nozzle with reference to the hole, and a second bottom surface positioned at an opposite direction side of the movement direction of the slit nozzle with reference to the hole. The width of the first bottom surface differs from that of the second bottom surface.

An exemplary embodiment of the present invention also discloses a coating method including mounting a substrate to a stage, and supplying a coating solution onto the substrate while the slit nozzle is moved to form a coating layer when the slit nozzle is moved. A distance between a bottom surface of the slit nozzle and the substrate is the same as the thickness of the coating layer.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
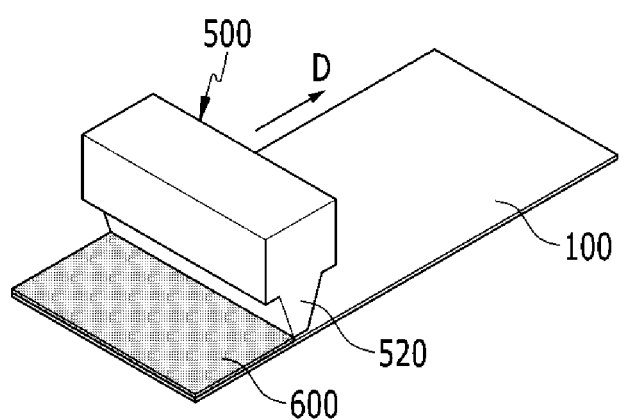
FIG. 1 is a perspective view of a portion of a slot die coater according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A slot die coater according to an exemplary embodiment of the present invention will be described with reference to FIG. 1 and FIG. 2.

Figure 2:
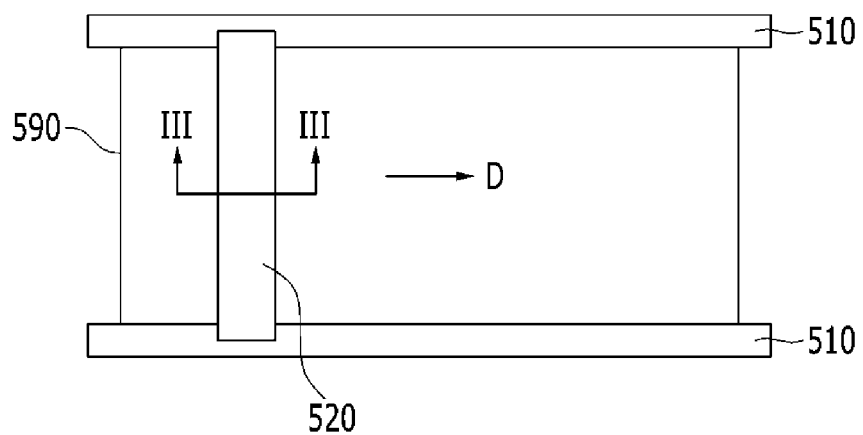
FIG. 2 is a top plan view of a slot die coater illustrated in FIG. 1.

FIG. 1 is a perspective view of a portion of a slot die coater according to an exemplary embodiment of the present invention, and FIG. 2 is a top plan view of a slot die coater according to an exemplary embodiment of the present invention.

A slot die coater 500 includes a slit nozzle 520. The slit nozzle 520 supplies a coating solution to form a coating layer 600 on a substrate 100. The coating solution is formed as a liquid, and the slit nozzle 520 supplies a predetermined amount of the coating solution while moving on the substrate 100 with a constant speed to uniformly coat it on the substrate 100.

The substrate 100 is mounted on a stage 590, and rails 510 are formed along both side edges of the stage 590. The slit nozzle 520 is moved from one side edge of the substrate 100 toward the opposite side edge along the rails 510.

Figure 3:
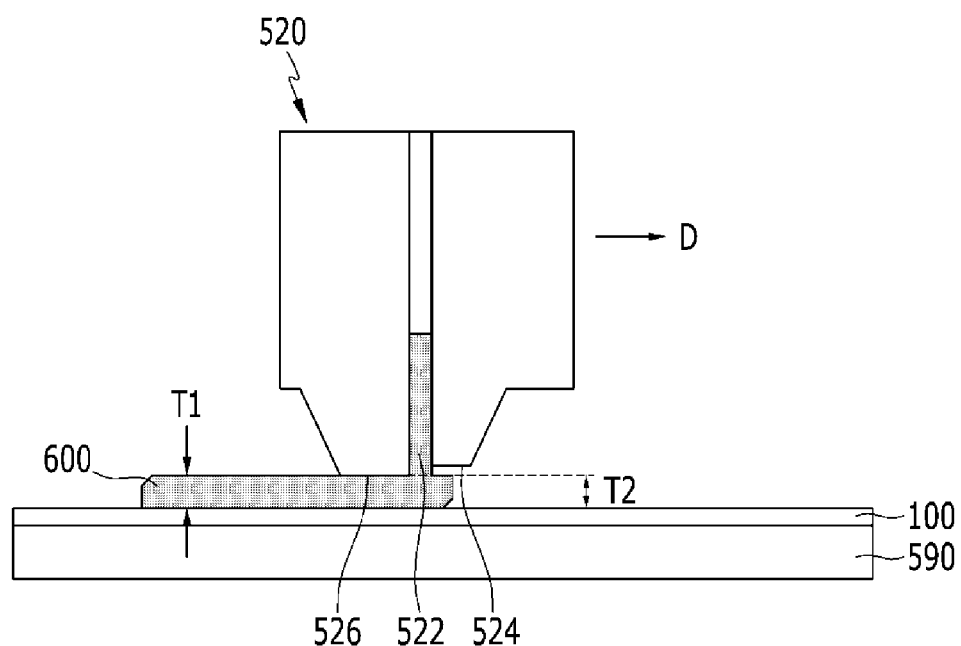
FIG. 3 is a cross-sectional view of a slit nozzle of a slot die coater taken along a line III-III of FIG. 2.
Figure 4:
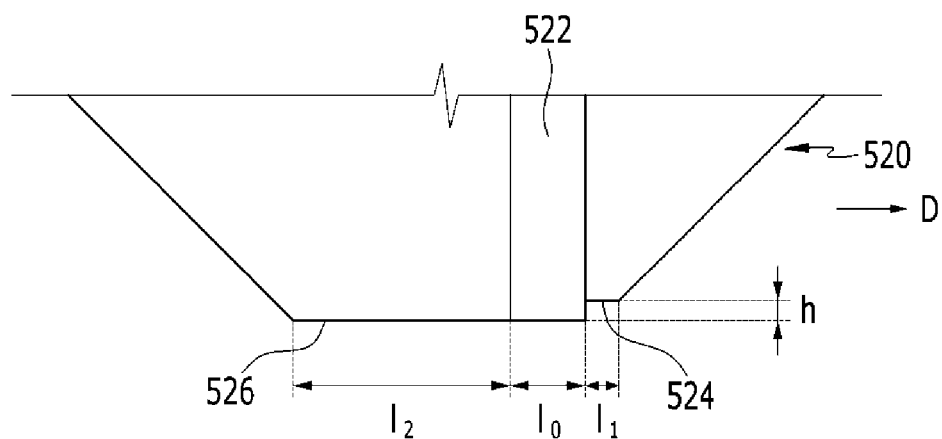
FIG. 4 is an enlarged cross-sectional view of a portion of the slit nozzle of FIG. 3.

Next, the slit nozzle 520 will be further described with reference to FIG. 3 and FIG. 4.

The slit nozzle 520 of the slot die coater 500 includes a hole 522 vertically penetrating a center portion thereof, a first bottom surface 524 positioned at a movement direction (D) side of the slit nozzle 520 with respect to the hole 522, and a second bottom surface 526 positioned at an opposite direction side of the slit nozzle 520 with respect to the hole 522.

The hole 522 may have a constant diameter, and the inside of the hole 522 may be filled with the coating solution. The coating solution is supplied to the outside through the hole 522. A width $l_0$ of the hole 522 may be 0.25 mm.

An upper portion of the slit nozzle 520 has a constant width, and the width is reduced after the center while proceeding to the bottom surface. The width $l_1$ of the first bottom surface 524 of the slit nozzle 520 is different from the width $l_2$ of the second bottom surface 526. The width $l_1$ of the first bottom surface 524 is narrower than the width $l_2$ of the second bottom surface 526. That is, the width of the bottom surface positioned at the movement direction (D) side of the slit nozzle 520 is narrower than the width of the bottom surface positioned at the opposite direction side of the movement direction (D) of the slit nozzle 520.

The width $l_1$ of the first bottom surface 524 is formed at 0.1 mm to 0.9 mm, and the width $l_2$ of the second bottom surface 526 is formed at 0.1 mm to 0.9 mm. Particularly, the width $l_2$ of the second bottom surface 526 may be more than 0.3 mm. The width $l_1$ of the first bottom surface 524 is narrower than the width $l_2$ of the second bottom surface 526 in this range. For example, the width $l_1$ of the first bottom surface 524 may be 0.1 mm, and the width $l_2$ of the second bottom surface 526 may be 0.7 mm.

The first bottom surface 524 is positioned above the second bottom surface 526. That is, the first bottom surface 524 positioned at the movement direction (D) side of the slit nozzle 520 is positioned above the second bottom surface 526 positioned at the opposite direction side of the movement direction (D) of the slit nozzle 520. Accordingly, when the slit nozzle 520 is positioned on the flat upper surface of the substrate 100, a distance between the first bottom surface 524 and the substrate 100 is greater than the distance between the second bottom surface 526 and the substrate 100. A height difference h of the first bottom surface 524 and the second bottom surface 526 may be about 0.07 mm.

Next, a method of forming a coating layer by using the slot die coater according to an exemplary embodiment of the present invention will be described again with reference to FIG. 1 to FIG. 4.

First, the substrate 100 is mounted to the stage 590. The slit nozzle 520 is then positioned at one side edge of the substrate 100. In this case, the distance T2 between the bottom surface of the slit nozzle 520 and the substrate 100 is set to be substantially the same as the thickness T1 of the coating layer 600. At this time, the distance T2 of the second bottom surface 526 of the slit nozzle 520 to the substrate 100 is set to be substantially the same as the thickness T1 of the coating layer 600. For example, when forming the coating layer 600 at about 60 µm, the second bottom surface 526 of the slit nozzle 520 is set to be separated from the substrate 100 by about 60 µm.

Because the first bottom surface 524 of the slit nozzle 520 is positioned above the second bottom surface 526, the distance between the first bottom surface 524 of the slit nozzle 520 and the substrate 100 is greater than the thickness of the coating layer 600.

In the state in which the coating solution is supplied through the hole 522 of the slit nozzle 520 and the coating solution is formed between the slit nozzle 520 and the substrate 100 to not be disconnected, the slit nozzle 520 is moved. The slit nozzle 520 is moved in the predetermined direction D from one side edge of the substrate 100 toward the other side edge. The slit nozzle 520 supplies the coating solution of the predetermined amount to the substrate 100 to form the coating layer 600 having the uniform thickness.

Because the distance between the second bottom surface 526 positioned at the opposite direction side of the movement direction (D) of the slit nozzle 520 and the substrate 100 corresponds to the thickness of the coating layer 600, the coating solution contacts the second bottom surface 526 whenever the slit nozzle 520 is moved. Accordingly, while the coating solution supplied through the hole 522 contacts the second bottom surface 526, the upper surface of the coating layer 600 may be flat. When the second bottom surface 526 has a width greater than the width of the first bottom surface 524, the contact time and the contact area with the coating solution are sufficient, thereby increasing the flatness of the upper surface of the coating layer 600.

Because the first bottom surface 524 of the movement direction (D) side of the slit nozzle 520 is positioned above the second bottom surface 526, and the distance between the first bottom surface 524 and the substrate 100 is greater than the thickness of the coating layer 600, the solution coated through the hole 522 may be prevented from amassing near the first bottom surface 524.

Next, the slot die coater according to an exemplary embodiment of the present invention will be described with reference to FIG. 5 and FIG. 6.

Figure 5:
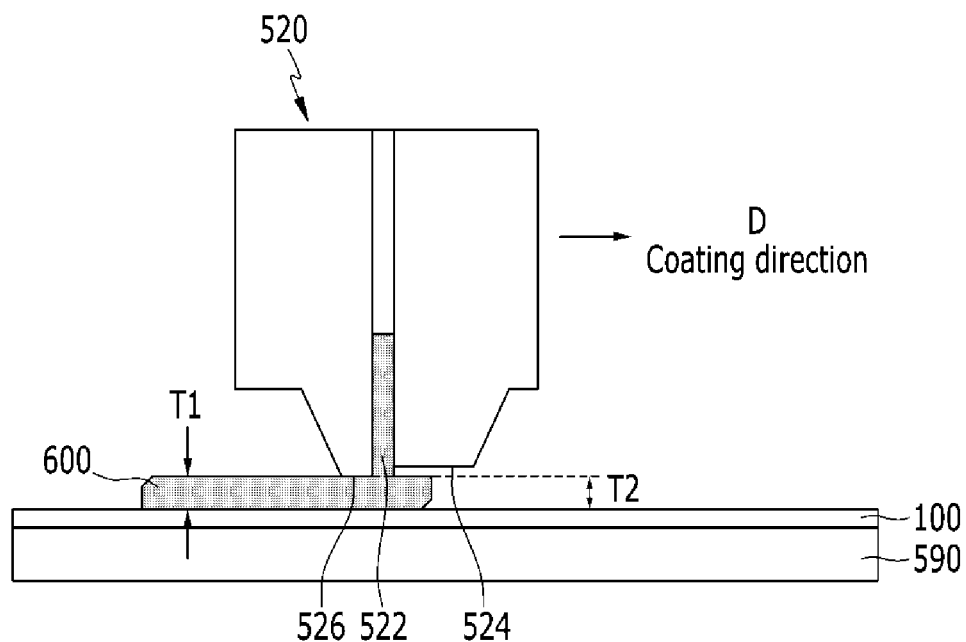
FIG. 5 is a cross-sectional view of a slit nozzle of a slot die coater according to another exemplary embodiment of the present invention.
Figure 6:
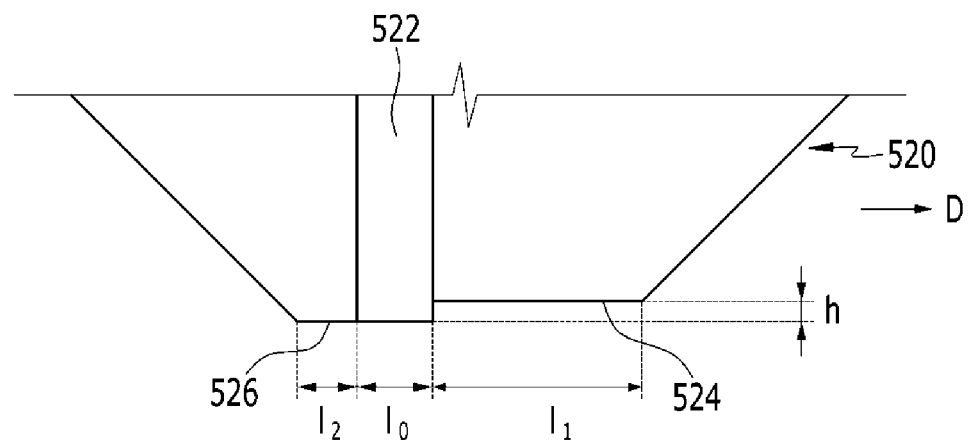
FIG. 6 is an enlarged cross-sectional view of a portion of the slit nozzle of FIG. 5.

A slot die coater according to an exemplary embodiment of the present invention shown in FIG. 5 and FIG. 6 is the same as most of the exemplary embodiment of the present invention shown in FIG. 1 to FIG. 4, such that the same description thereof is omitted. In the previous exemplary embodiment, the first bottom surface has a narrower width than the width of the second bottom surface. However, in the present exemplary embodiment, the second bottom surface has a narrower width than the width of the first bottom surface, and this will be described in detail.

The slit nozzle 520 of the slot die coater includes a hole 522 vertically penetrating a center portion thereof, a first bottom surface 524 positioned at a movement direction (D) side of the slit nozzle 520 with respect to the hole 522, and a second bottom surface 526 positioned at an opposite direction side of the slit nozzle 520 with respect to the hole 522.

The upper portion of the slit nozzle 520 has a constant width, and the width is decreased closer to the bottom surface. The width $l_1$ of the first bottom surface 524 of the slit nozzle 520 is different from the width $l_2$ of the second bottom surface 526. The width $l_2$ of the second bottom surface 526 is less than the width $l_1$ of the first bottom surface 524. That is, the width of the bottom surface positioned at the opposite direction side of the slit nozzle 520 is less than the width of the bottom surface positioned at the movement direction (D) side of the slit nozzle 520.

The width $l_1$ of the first bottom surface 524 may be in a range of 0.1 mm to 0.9 mm, and the width $l_2$ of the second bottom surface 526 may be in a range of 0.1 mm to 0.9 mm. Particularly, the width $l_1$ of the first bottom surface 524 may be more than 0.3 mm. The width $l_2$ of the second bottom surface 526 is less than the width $l_1$ of the first bottom surface 524 in this range. For example, the width $l_2$ of the second bottom surface 526 may be 0.1 mm, and the width $l_1$ of the first bottom surface 524 may be 0.7 mm.

The first bottom surface 524 is positioned above the second bottom surface 526. That is, the bottom surface positioned at the movement direction (D) side of the slit nozzle 520 is positioned above the bottom surface positioned at the opposite direction side of the movement direction (D) of the slit nozzle 520. Accordingly, when the slit nozzle 520 is positioned on the flat upper surface of the substrate 100, a distance between the first bottom surface 524 and the substrate 100 is greater than the distance between the second bottom surface 526 and the substrate 100. The height difference h of the first bottom surface 524 and the second bottom surface 526 may be about 0.07 mm.

The method of forming the coating layer by using the slot die coater according to an exemplary embodiment of the present invention shown in FIG. 5 and FIG. 6 is similar to the method of forming the coating layer by using the slot die coater shown in FIG. 1 to FIG. 4.

The substrate 100 is mounted to the stage 590, and the distance T2 between the second bottom surface 526 of the slit nozzle 520 and the substrate 100 is set to be substantially the same as the thickness T1 of the coating layer 600. Next, the coating solution is supplied through the hole 522 of the slit nozzle 520, and the coating layer 600 having the predetermined thickness is formed on the substrate 100 while moving the slit nozzle 520 in the state in which the coating solution is not disconnected between the slit nozzle 520 and the substrate 100.

Because the distance between the second bottom surface 526 positioned at the opposite direction side of the movement direction D of the slit nozzle 520 and the substrate 100 corresponds to the thickness of the coating layer 600, the coating solution contacts the second bottom surface 526 whenever the slit nozzle 520 is moved. Accordingly, while the coating solution supplied through the hole 522 contacts the second bottom surface 526, the upper surface of the coating layer 600 may be planarized.

The first bottom surface 524 positioned in the movement direction (D) side of the slit nozzle 520 is positioned above the second bottom surface 526, and the distance between the first bottom surface 524 and the substrate 100 is greater than the thickness of the coating layer 600 such that the coating solution supplied through the hole 522 may be prevented from amassing near the first bottom surface 524. Because the width of the first bottom surface 524 is greater than the width of the second bottom surface 526, the coating solution gathered near the first bottom surface 524 may be further uniformly flat.

The slot die coater according to an exemplary embodiment of the present invention may be used for manufacturing the display device. Next, a display device manufactured by using the slot die coater according to an exemplary embodiment of the present invention will be described with reference to FIG. 7 to FIG. 11.

Figure 7:
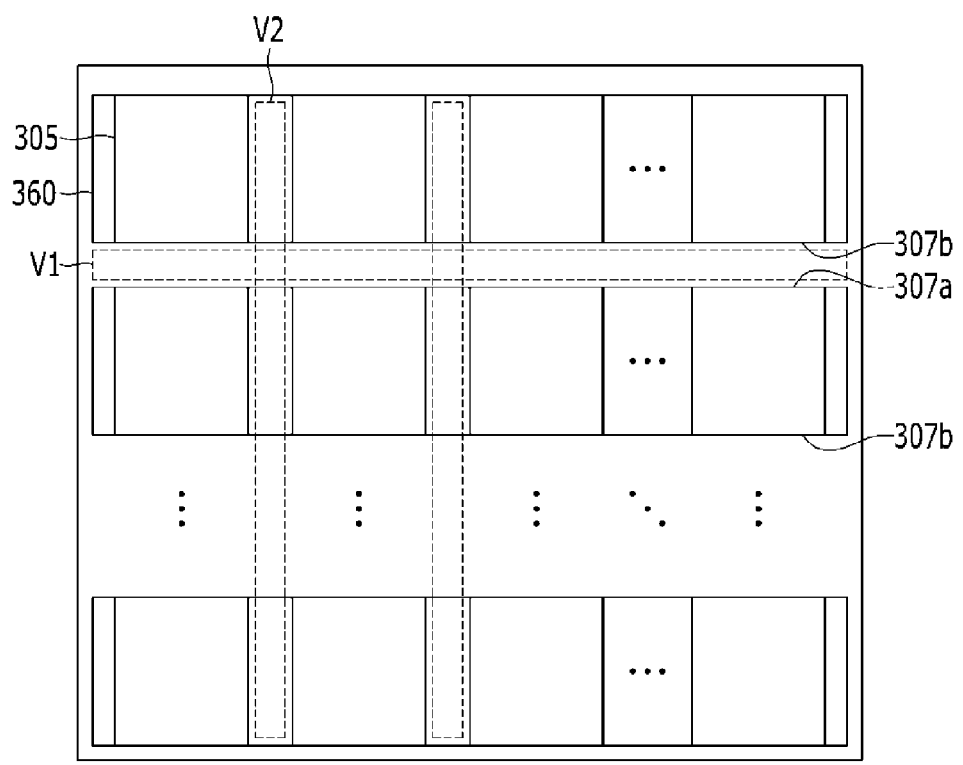
FIG. 7 is a top plan view of a display device manufactured by using a slot die coater according to an exemplary embodiment of the present invention.

First, the display device manufactured by using the slot die coater according to an exemplary embodiment of the present invention will be schematically described with reference to FIG. 7.

The display device includes a substrate 110 made of a material such as glass or plastic.

A microcavity 305 covered by a roof layer 360 is formed on the substrate 110. The roof layer 360 extends in a row direction, and a plurality of microcavities 305 are formed below one roof layer 360.

The microcavities 305 may be disposed in a matrix form, first valleys V1 are positioned between the microcavities 305 adjacent to each other in a column direction, and second valleys V2 are positioned between the microcavities 305 adjacent to each other in a row direction.

A plurality of roof layers 360 are separated from each other with the first valleys V1 disposed therebetween. The microcavity 305 is not covered by the roof layer 360, but may be exposed to the outside at a portion contacting the first valley V1. This arrangement is referred to as injection holes 307a and 307b.

The injection holes 307a and 307b are formed at respective edges of the microcavity 305. The injection holes 307a and 307b include a first injection hole 307a and a second injection hole 307b, and the first injection hole 307a is formed so as to expose a lateral surface of a first edge of the microcavity 305, and the second injection hole 307b is formed so as to expose a lateral surface of a second edge of the microcavity 305. The lateral surface of the first edge and the lateral surface of the second edge of the microcavity 305 face each other.

Each roof layer 360 is formed to be spaced apart from the substrate 110 between the adjacent second valleys V2 to form the microcavity 305. That is, the roof layer 360 is formed so as to cover the remaining lateral surfaces, except for the lateral surfaces of the first edge and the second edge in which the injection holes 307a and 307b are formed.

The aforementioned structure of the display device is just an example, and various modifications may be made. For example, an arrangement form of the microcavity 305, the first valley V1, and the second valley V2 may be changed; the plurality of roof layers 360 may be connected to each other in the first valley V1; or a portion of each roof layer 360 may be formed to be spaced apart from the substrate 110 in the second valley V2 to connect the adjacent microcavities 305 to each other.

Figure 8:
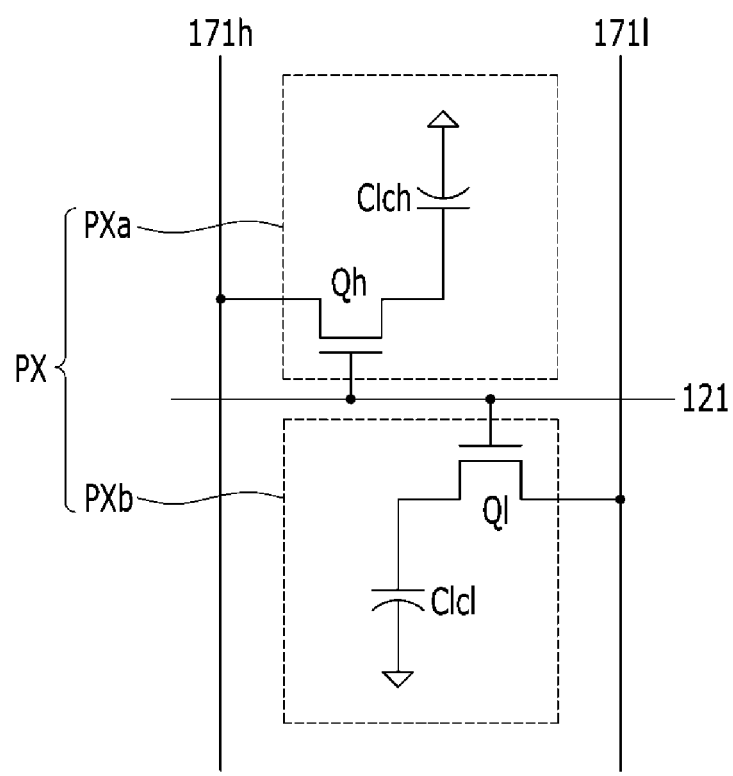
FIG. 8 is an equivalent circuit diagram of one pixel of a display device manufactured by using a slot die coater according to an exemplary embodiment of the present invention.

Hereinafter, one pixel of the display device manufactured by using the slot die coater according to the exemplary embodiment of the present invention will be schematically described with reference to FIG. 8, which is an equivalent circuit diagram of one pixel of a display device manufactured by using a slot die coater.

The display device manufactured by using a slot die coater according to an exemplary embodiment of the present invention includes a plurality of signal lines 121, 171h, and 171l, and a pixel PX connected thereto. Although not shown, the plurality of pixels PX may be arranged in a matrix form including a plurality of pixel rows and a plurality of pixel columns.

Each pixel PX may include a first subpixel PXa and a second subpixel PXb. The first subpixel PXa and the second subpixel PXb may be vertically disposed. In this case, the first valley V1 may be positioned in a direction of a pixel row between the first subpixel PXa and the second subpixel PXb, and the second valley V2 may be positioned between the plurality of pixel columns.

The signal lines 121, 171h, and 171l include a gate line 121 for transmitting a gate signal, and a first data line 171h and a second data line 171l of a data line 171 for transmitting different data voltages.

The display device includes a first switching element Qh connected to the gate line 121 and the first data line 171h, and a second switching element Ql connected to the gate line 121 and the second data line 171l.

A first liquid crystal capacitor Clch connected with the first switching element Qh is formed in the first subpixel PXa, and a second liquid crystal capacitor Clcl connected with the second switching element Ql is formed in the second subpixel PXb.

A first terminal of the first switching element Qh is connected with the gate line 121, a second terminal thereof is connected with the first data line 171h, and a third terminal thereof is connected to the first liquid crystal capacitor Clch.

A first terminal of the second switching element Ql is connected with the gate line 121, a second terminal thereof is connected with the second data line 171l, and a third terminal thereof is connected to the second liquid crystal capacitor Clcl.

An operation of the liquid crystal display will now be described. When a gate-on voltage is applied to the gate line 121, the first switching element Qh and the second switching element Ql connected to the gate line 121 are turned on, and the first and second liquid crystal capacitors Clch and Clcl are charged with different data voltages transmitted through the first and second data lines 171h and 171l. The data voltage transmitted by the second data line 171l is lower than the data voltage transmitted by the first data line 171h. Accordingly, the second liquid crystal capacitor Clcl is charged with a lower voltage than that of the first liquid crystal capacitor Clch, thereby improving side visibility.

Hereinafter, a structure of one pixel of the display device manufactured by using the slot die coater according to the exemplary embodiment of the present invention will be described with reference to FIG. 9 to FIG. 11.

Figure 9:
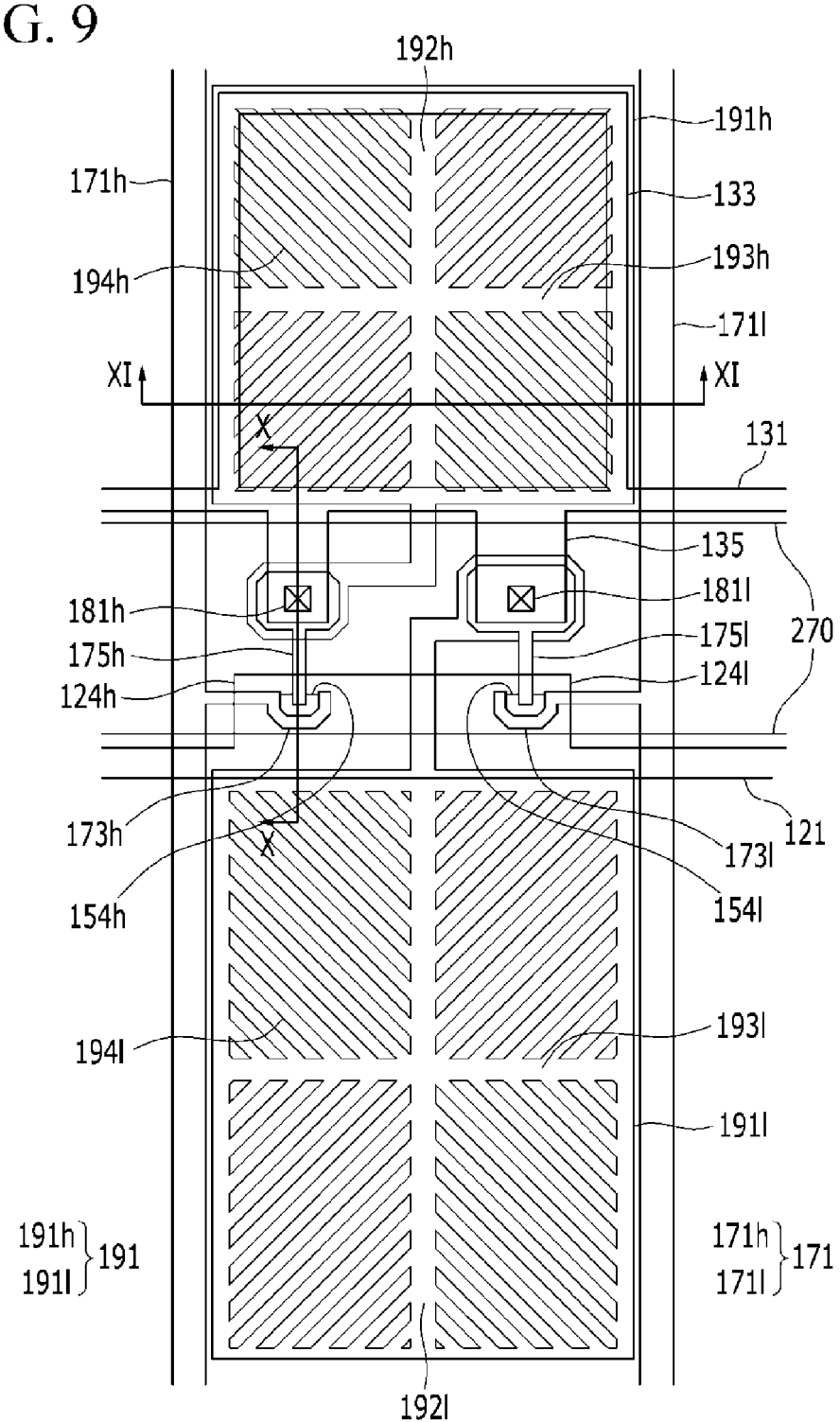
FIG. 9 is a layout view of a portion of a display device manufactured by using a slot die coater according to an exemplary embodiment of the present invention.
Figure 10:
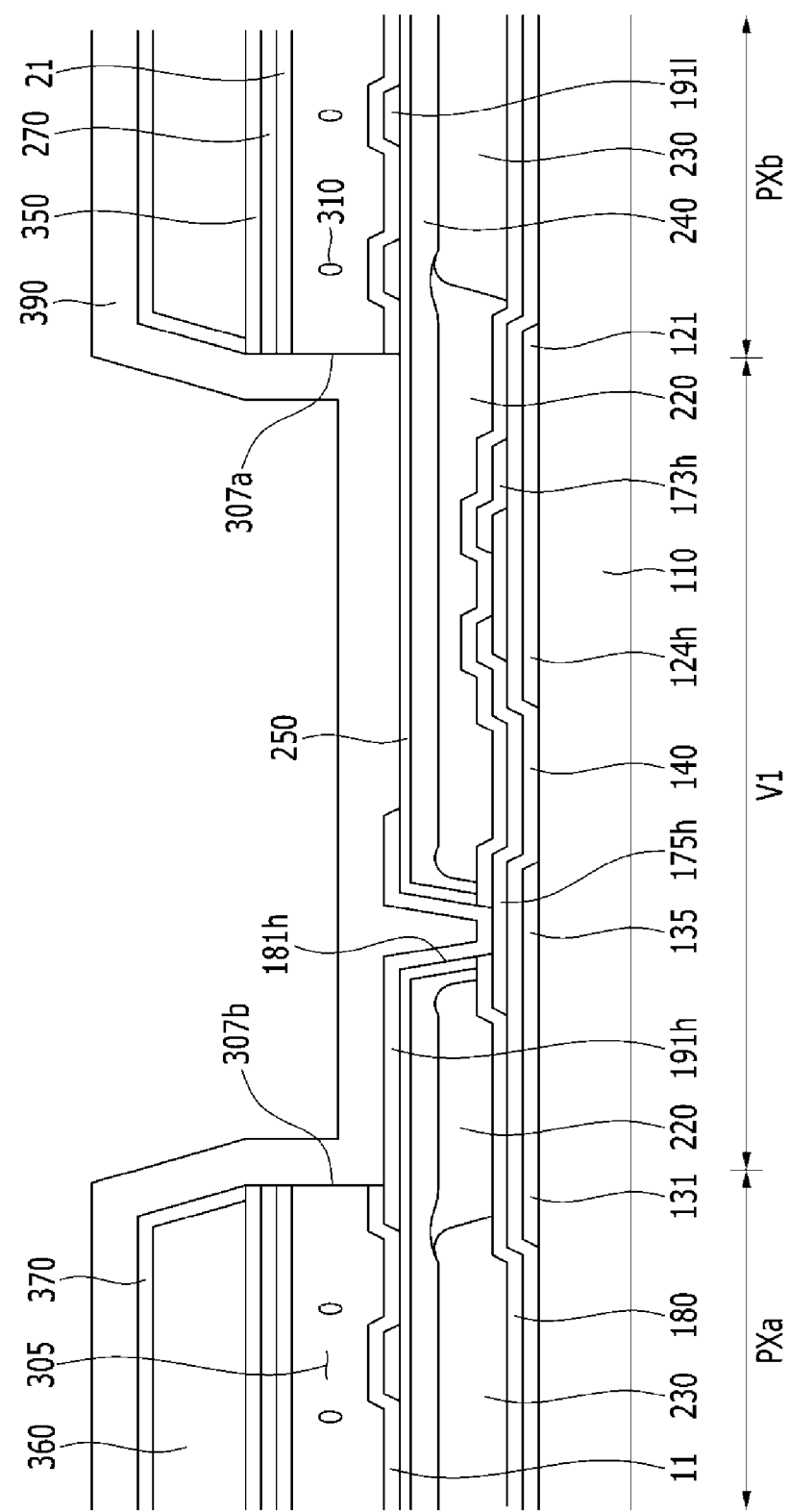
FIG. 10 is a cross-sectional view of a display device manufactured by using a slot die coater taken along a line X-X of FIG. 9.
Figure 11:
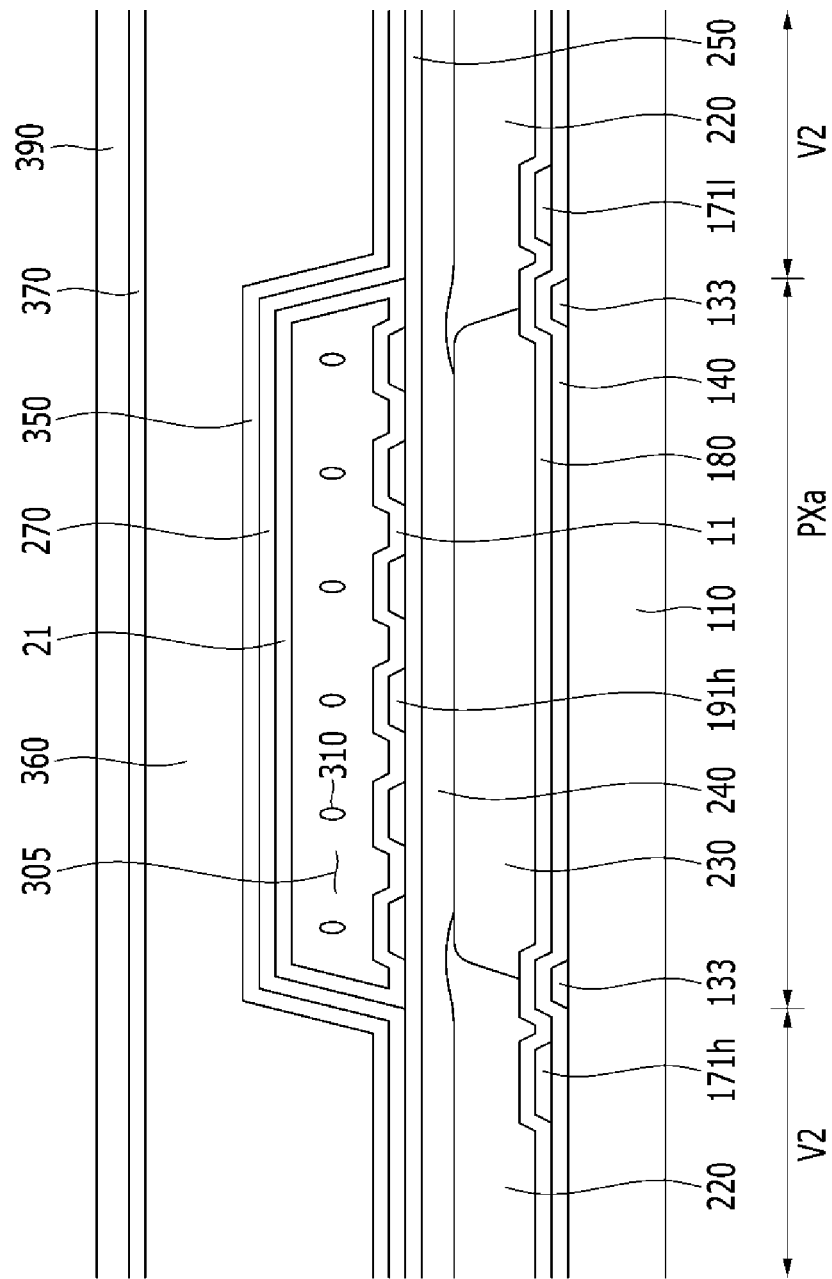
FIG. 11 is a cross-sectional view of a display device manufactured by using a slot die coater taken along a line XI-XI of FIG. 9.

Referring to FIG. 9 to FIG. 11, the gate line 121, a first gate electrode 124h, and a second gate electrode 124l protruding from the gate line 121 are formed on the substrate 110.

The gate line 121 mainly extends in a first direction, and transmits a gate signal. The gate line 121 is positioned between two microcavities 305 which are adjacent in a column direction. That is, the gate line 121 is positioned at the first valley V1. The first gate electrode 124h and the second gate electrode 124l upwardly protrude from the gate line 121 in a plane view. The first gate electrode 124h and the second gate electrode 124l are connected to each other to form one protrusion. However, the present invention is not limited thereto, and the protruding form of the first gate electrode 124h and the second gate electrode 124l may be variously modified.

A storage electrode line 131 and storage electrodes 133 and 135 protruding from the storage electrode line 131 may be further formed on the substrate 110.

The storage electrode line 131 extends in a direction parallel to the gate line 121, and is formed to be spaced apart from the gate line 121. A predetermined voltage may be applied to the storage electrode line 131. The storage electrode 133 protruding on the storage electrode line 131 is formed to enclose the edge of the first subpixel PXa. The storage electrode 135 protruding under the storage electrode line 131 is formed to be adjacent to the first gate electrode 124h and the second gate electrode 124l.

A gate insulating layer 140 is formed on the gate line 121, the first gate electrode 124h, the second gate electrode 124l, the storage electrode line 131, and the storage electrodes 133 and 135. The gate insulating layer 140 may be formed of an inorganic insulating material, such as a silicon nitride ($SiN_x$) and a silicon oxide ($SiO_x$). Further, the gate insulating layer 140 may be a single layer or a multilayer.

A first semiconductor 154h and a second semiconductor 154l are formed on the gate insulating layer 140. The first semiconductor 154h may be positioned on the first gate electrode 124h, and the second semiconductor 154l may be positioned on the second gate electrode 124l. The first semiconductor 154h may be elongated toward a lower portion of the first data line 171h, and the second semiconductor 154l may be elongated toward a lower portion of the second data line 171l. The first semiconductor layer 154h and the second semiconductor 154l may be formed of amorphous silicon, polycrystalline silicon, a metal oxide, or the like.

An ohmic contact member (not illustrated) may be formed on each of the first semiconductor 154h and the second semiconductor 154l. The ohmic contact members may be made of a silicide or a material, such as n+ hydrogenated amorphous silicon on which an n-type impurity is doped at a high concentration.

The first data line 171h, the second data line 171l, a first source electrode 173h, a first drain electrode 175h, a second source electrode 173l, and a second drain electrode 175l are formed on the first semiconductor 154h, the second semiconductor 154l, and the gate insulating layer 140.

The first data line 171h and the second data line 171l transfer a data signal, and mainly extend in a second direction to cross the gate line 121 and the storage electrode line 131. The data line 171 is positioned between the two microcavities 305 that are adjacent in the row direction. That is, the data line 171 is positioned in the second valley V2.

The first data line 171h and the second data line 171l transmit different data voltages. The data voltage transmitted by the second data line 171l is lower than the data voltage transmitted by the first data line 171h.

The first source electrode 173h is formed to protrude on the first gate electrode 124h from the first data line 171h, and the second source electrode 173l is formed to protrude on the second gate electrode 124l from the second data line 171l. Each of the first drain electrode 175h and the second drain electrode 175l has one wide end portion and the other rod-shaped end portion. The wide end portions of the first drain electrode 175h and the second drain electrode 175l overlap the storage electrode 135 downwardly protruding from the storage electrode line 131. Each of the rod-shaped end portions of the first drain electrode 175h and the second drain electrode 175l is partially surrounded by the first source electrode 173h and the second source electrode 173l.

The first and second gate electrodes 124h and 124l, the first and second source electrodes 173h and 173l, and the first and second drain electrodes 175h and 175l form first and second thin film transistors (TFT) Qh and Q1 together with the first and second semiconductors 154h and 154l, and channels of the thin film transistors are formed in the semiconductors 154h and 154l between the source electrodes 173h and 173l and the drain electrodes 175h and 175l, respectively.

A passivation layer 180 is formed on the first semiconductor 154h exposed between the first data line 171h, the second data line 171l, the first source electrode 173h, the first drain electrode 175h, the first source electrode 173h, and the first drain electrode 175h, and the second semiconductor 154l exposed between the second source electrode 173l, the drain electrode 175l, the second source electrode 173l, and the second drain electrode 175l. The passivation layer 180 may be formed of an organic insulating material or an inorganic insulating material, and may be formed of a single layer or a multilayer.

A color filter 230 is formed in each pixel PX on the passivation layer 180. Each color filter 230 displays one among primary colors such as three primary colors of red, green, and blue. The color filter 230 is not limited to the three primary colors of red, green, and blue, and may represent colors such as cyan, magenta, yellow, and a white-containing color. The color filter 230 may not be formed at the first valley V1.

A light blocking member 220 is formed in a region between the neighboring color filters 230. The light blocking member 220 is formed at a boundary of the pixel PX and the thin film transistor to prevent light leakage. That is, the light blocking member 220 may be formed in the first valley V1 and the second valley V2. The color filter 230 and the light blocking member 220 may be partially overlapped with each other.

A first insulating layer 240 may be further formed on the color filter 230 and the light blocking member 220. The first insulating layer 240 may be formed of an organic insulating material, and may serve to planarize the color filters 230.

A second insulating layer 250 may be further formed on the first insulating layer 240. The second insulating layer 250 may be formed of an inorganic insulating material, and may serve to protect the color filter 230 and the first insulating layer 240.

A first contact hole 181h through which the wide end portion of the first drain electrode 175h is exposed and a second contact hole 181*l* through which the wide end portion of the second drain electrode 175*l* is exposed are formed in the passivation layer 180, the first insulating layer 240, and the second insulating layer 250.

A pixel electrode 191 is formed on the second insulating layer 250. The pixel electrode 191 may be formed of a transparent metal material, such as indium-tin oxide (ITO) and indium-zinc oxide (IZO).

The pixel electrode 191 includes a first subpixel electrode 191*h* and a second subpixel electrode 191*l*, which are separated from each other with the gate line 121 and the storage electrode line 131 interposed therebetween. The first subpixel electrode 191*h* and the second subpixel electrode 191*l* are disposed on and under the pixel PX based on the gate line 121 and the storage electrode line 131. That is, the first sub-pixel electrode 191*h* and the second sub-pixel electrode 191*l* are separated from each other with the first valley V1 interposed therebetween, and the first sub-pixel electrode 191*h* is positioned in the first sub-pixel PXa and the second sub-pixel electrode 191*l* is positioned in the second sub-pixel PXb.

The first sub-pixel electrode 191*h* is connected to the first drain electrode 175*h* through the first contact hole 181*h*, and the second sub-pixel electrode 191*l* is connected to the second drain electrode 175*l* through the second contact hole 181*l*. Accordingly, when the first thin film transistor Qh and the second thin film transistor Ql are in an on-state, the first sub-pixel electrode 191*h* and the second sub-pixel electrode 191*l* receive different data voltages from the first drain electrode 175*h* and the second drain electrode 175*l*, respectively. An electric field may be formed between the pixel electrode 191 and a common electrode 270.

Each of the first sub-pixel electrode 191*h* and the second sub-pixel electrode 191*l* has a quadrangular shape, and the first sub-pixel electrode 191*h* and the second sub-pixel electrode 191*l* include cross-shaped stem portions formed by horizontal stem portions 193*h* and 193*l* and vertical stem portions 192*h* and 192*l* crossing the horizontal stem portions 193*h* and 193*l*. Further, each of the first sub-pixel electrode 191*h* and the second sub-pixel electrode 191*l* includes a plurality of micro-branch portions 194*h* and 194*l*.

The pixel electrode 191 is divided into four sub-regions by the horizontal stem portions 193*h* and 193*l* and the vertical stem portions 192*h* and 192*l*. The micro-branch portions 194*h* and 194*l* obliquely extend from the horizontal stem portions 19*h*1 and 193*l* and the vertical stem portions 192*h* and 192*l*, and the extension direction may form an angle of approximately 45° or 135° with the gate line 121 or the horizontal stem portions 193*h* and 193*l*. Further, the directions in which the micro-branch portions 194*h* and 194*l* in two adjacent sub-regions extend may be orthogonal to each other.

In the present exemplary embodiment, the first sub-pixel electrode 191*h* and the second sub-pixel electrode 191*l* may further include outer stem portions surrounding outer sides of the first sub-pixel PXa and the second sub-pixel PXb, respectively.

The disposition form of the pixel, the structure of the thin film transistor, and the shape of the pixel electrode described constitute only one example, and various modifications may be made.

The common electrode 270 is formed on the pixel electrode 191 so as to be spaced apart from the pixel electrode 191 by a predetermined distance. The microcavity 305 is formed between the pixel electrode 191 and the common electrode 270. That is, the microcavity 305 is surrounded by the pixel electrode 191 and the common electrode 270. The common electrode 270 is formed in the row direction and is disposed on the microcavity 305 and at the second valley V2. The common electrode 270 is formed to cover the upper surface and the side of the microcavity 305. A width and an area of the microcavity 305 may be variously modified according to a size and resolution of the display device.

In each PX, the common electrode 270 is formed to be separated from the substrate 110, thereby forming the microcavity 305, but in the second valley V2, the common electrode 270 is formed to be attached to the substrate 110. In the second valley V2, the common electrode 270 is disposed immediately above the second insulating layer 250.

The common electrode 270 may be formed of a transparent metal material, such as indium-tin oxide (ITO) or indium-zinc oxide (IZO). A predetermined voltage may be applied to the common electrode 270, and an electric field may be formed between the pixel electrode 191 and the common electrode 270.

A first alignment layer 11 is formed on the pixel electrode 191. The first alignment layer 11 may also be formed right on the first insulating layer 240 which is not covered by the pixel electrode 191.

A second alignment layer 21 is formed under the common electrode 270 to face the first alignment layer 11.

The first alignment layer 11 and the second alignment layer 21 may be formed as vertical alignment layers, and may be formed of an alignment material, such as polyamic acid, polysiloxane, or polyimide. The first and second alignment layers 11 and 21 may be connected on a side wall of the edge of the microcavity 305.

A liquid crystal layer formed of liquid crystal molecules 310 is formed in the microcavity 305 positioned between the pixel electrode 191 and the common electrode 270. The liquid crystal molecules 310 have negative dielectric anisotropy, and may be erected in a vertical direction on the substrate 110 in a state where an electric field is not applied. That is, vertical alignment may be implemented.

The first sub-pixel electrode 191*h* and the second sub-pixel electrode 191*l*, to which the data voltage is applied, generate an electric field together with the common electrode 270 to determine a direction of the liquid crystal molecules 310 positioned in the microcavity 305 between the two electrodes 191 and 270. Luminance of light passing through the liquid crystal layer is changed according to the thusly determined direction of the liquid crystal molecules 310.

A third insulating layer 350 may be further formed on the common electrode 270. The third insulating layer 350 may be formed of an inorganic insulating material, such as a silicon nitride ($SiN_x$) and a silicon oxide ($SiO_x$), and may be omitted if necessary.

A roof layer 360 is formed on the third insulating layer 350. The roof layer 360 may be formed of an organic material. The roof layer 360 is formed in the row direction and is disposed on the microcavity 305 and at the second valley V2. The roof layer 360 is formed to cover the upper surface and the lateral surface of the microcavity 305. The roof layer 360 may be hardened by a hardening process to maintain the shape of the microcavity 305. That is, the roof layer 360 is spaced apart from the pixel electrode 191 with the microcavity 305 interposed therebetween.

The common electrode 270 and the roof layer 360 expose the side surface of the edge of the microcavity 305, and portions where the microcavity 305 is not covered by the common electrode 270 and the roof layer 360 are injection holes 307*a* and 307*b*. The injection holes 307*a* and 307*b* include a first injection hole 307*a*, through which a lateral surface of a first edge of the microcavity 305 is exposed, and a second injection hole 307b, through which a lateral surface of a second edge of the microcavity 305 is exposed. The first edge and the second edge face each other, and for example, in a plan view, the first edge may be an upper edge of the microcavity 305 and the second edge may be a lower edge of the microcavity 305. The injection holes 307a and 307b expose side surfaces of the edges of the microcavity 305, adjacent to the first valley V1. The microcavities 305 are exposed by the injection holes 307a and 307b, so that an alignment solution, a liquid crystal material, or the like may be injected into the microcavities 305 through the injection holes 307a and 307b.

A fourth insulating layer 370 may be further formed on the roof layer 360. The fourth insulating layer 370 may be made of an inorganic insulating material, such as a silicon nitride ($SiN_x$) and a silicon oxide ($SiO_x$). The fourth insulating layer 370 may be formed to cover the top and the side of the roof layer 360. The fourth insulating layer 370 serves to protect the roof layer 360 made of an organic material, and may be omitted if necessary.

An encapsulation layer 390 may be formed on the fourth insulating layer 370. The encapsulation layer 390 is formed to cover the injection holes 307a and 307b where a part of the microcavity 305 is exposed to the outside. That is, the encapsulation layer 390 may seal the microcavity 305 so that the liquid crystal molecules 310 formed in the microcavity 305 are not discharged to the outside. The encapsulation layer 390 contacts the liquid crystal molecule 310 such that the encapsulation layer 390 may be made of a material that does not react with the liquid crystal molecules 310. For example, the encapsulation layer 390 may be made of parylene.

The encapsulation layer 390 may be formed by using the slot die coater according to an exemplary embodiment of the present invention. By using the slot die coater according to an exemplary embodiment of the present invention, as described above, the upper surface of the encapsulation layer 390 may be planarized.

The encapsulation layer 390 may be formed as a multi-layer, such as a double layer or a triple layer. The double layer is configured by two layers made of different materials. The triple layer is configured by three layers, and materials of adjacent layers are different from each other. For example, the encapsulation layer 390 may include a layer made of an organic insulating material and a layer made of an inorganic insulating material.

Although not illustrated, polarizers may be further formed on the upper and lower sides of the display device. The polarizers may include a first polarizer and a second polarizer. The first polarizer may be attached to the lower surface of the substrate 110, and the second polarizer may be attached to the encapsulation layer 390. The upper surface of the encapsulation layer 390 is flat, such that lifting may be prevented in the process of adhering the second polarizer on the encapsulation layer 390.

Next, the flatness of the upper surface of the encapsulation layer of the display device manufactured by using the slot die coater according to an exemplary embodiment of the present invention will be described with reference to FIG. 12.

Figure 12:
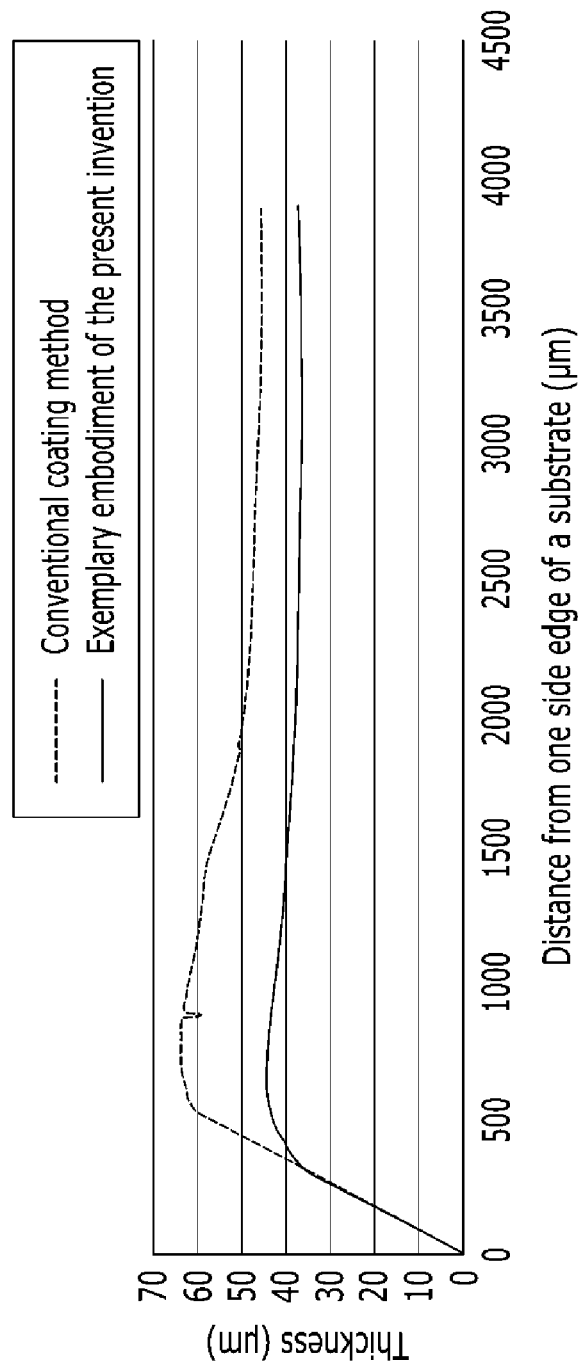
FIG. 12 is a graph comparing a thickness of an encapsulation layer formed by using a slot die coater according to an exemplary embodiment of the present invention with a thickness of an encapsulation layer manufactured by a conventional method.

FIG. 12 is a graph comparing a thickness of an encapsulation layer formed by using a slot die coater according to an exemplary embodiment of the present invention and a thickness of an encapsulation layer manufactured by a conventional method.

A process of forming the encapsulation layer by a conventional method is performed in a predetermined state in which the distance between the bottom surface of the slit nozzle and the substrate is greater than the thickness of the encapsulation layer. Also, the width of the first bottom surface positioned at the movement direction side of the slit nozzle is the same as the width of the second bottom surface positioned at the opposite direction side of the movement direction. Further, the up and down position of the first bottom surface and the second bottom surface is the same. That is, the distance between the first bottom surface and the substrate is the same as the distance between the second bottom surface and the substrate. When forming the encapsulation layer while moving the slit nozzle from one side edge to the other side edge of the substrate, the thickness is increased from 0 μm at the position where the coating starts to about 500 μm, the thickness is decreased after the position of 1000 μm, and then the thickness becomes uniform when the slit nozzle reaches the position of about 2000 μm.

In contrast, when forming the encapsulation layer by using the slot die coater according to an exemplary embodiment of the present invention, the thickness is gradually increased from 0 μm as the position where the coating starts to about 500 μm, and the thickness becomes uniform to the position of about 500 μm. That is, in the case by the present invention, it may be confirmed that the increasing and decreasing thickness of the encapsulation layer is small compared with the conventional method, and the entire thickness is uniform. Accordingly, the encapsulation layer having high flatness and uniformity may be formed by using the slot die coater according to an exemplary embodiment of the present invention.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A slot die coater comprising:
a slit nozzle configured to supply a coating solution onto a substrate,
wherein:
the slit nozzle comprises:
a hole vertically penetrating a center portion thereof;
a first bottom surface positioned at a movement direction side of the slit nozzle with reference to the hole; and
a second bottom surface positioned at an opposite direction side of the movement direction of the slit nozzle with reference to the hole;
the first bottom surface and the second bottom surface are flat and parallel to an upper surface of the substrate;
the width of the first bottom surface is less than the width of the second bottom surface; and
both the front side and the rear side of a lower portion of the slit nozzle are tapered toward the first and second bottom surfaces.

2. The slot die coater of claim 1 wherein a distance between the first bottom surface and the substrate is greater than a distance between the second bottom surface and the substrate.

3. The slot die coater of claim 1, wherein:
the first bottom surface has a width of 0.1 mm to 0.9 mm; and the second bottom surface has a width of 0.1 mm to 0.9 mm.

4. A coating method comprising:

mounting a substrate on a stage; and moving a slit nozzle over the substrate while supplying a coating solution to the substrate to form a coating layer, wherein the slit nozzle comprises:

a hole vertically penetrating a center portion thereof;

a first bottom surface disposed at a movement direction side of the slit nozzle with reference to the hole; and a second bottom surface disposed at an opposite direction side of the movement direction of the slit nozzle with reference to the hole;

the first bottom surface and the second bottom surface are flat and parallel to an upper surface of the substrate;

the width of the first bottom surface is different from the width of the second bottom surface; and during moving of the slit nozzle, a distance between the second bottom surface and the substrate is substantially the same as the thickness of the coating layer.

5. The coating method of claim 4, wherein, during moving of the slit nozzle, the distance between the first bottom surface and the substrate is greater than the thickness of the coating layer.

6. The coating method of claim 4, wherein the width of the first bottom surface is less than the width of the second bottom surface.

7. The coating method of claim 6, wherein a distance between the first bottom surface and the substrate is greater than a distance between the second bottom surface and the substrate.

* * * * *

UNITED STATES PATENT AND TRADEMARK OFFICE
CERTIFICATE OF CORRECTION

PATENT NO.      : 9,581,872 B2                        Page 1 of 1
APPLICATION NO. : 14/623468
DATED           : February 28, 2017
INVENTOR(S)     : Jae Cheol Park et al.

It is certified that error appears in the above-identified patent and that said Letters Patent is hereby corrected as shown below:

On the Title Page

In item (73), Assignee add:
--K.C. TECH Co., Ltd., Anseong-si (KR)--.

Signed and Sealed this
Twenty-third Day of May, 2017

Michelle K. Lee
*Director of the United States Patent and Trademark Office*